United States Patent [19]

Takada et al.

[11] Patent Number: 5,387,491
[45] Date of Patent: Feb. 7, 1995

[54] PHOTOSENSITIVE TRANSFER SHEET

[75] Inventors: Toshihiko Takada; Norio Yabe; Masahide Takano, all of Higashimatsuyama, Japan

[73] Assignee: Nippon Paper Industries, Co., Ltd., Tokyo, Japan

[21] Appl. No.: 215,472

[22] Filed: Mar. 21, 1994

[30] Foreign Application Priority Data

Aug. 25, 1993 [JP] Japan .................. 5-232467

[51] Int. Cl.$^6$ ............................. G03C 1/805
[52] U.S. Cl. .................. 430/259; 430/232; 430/238; 430/247; 430/256
[58] Field of Search ............... 430/232, 238, 259, 247, 430/256, 627, 637, 909

[56] References Cited

U.S. PATENT DOCUMENTS

| | | | |
|---|---|---|---|
| 3,239,337 | 3/1966 | Haas | 430/238 |
| 3,647,464 | 3/1972 | Smith et al. | 430/232 |
| 4,124,388 | 11/1978 | Bronstein-Bonte et al. | 430/238 |

FOREIGN PATENT DOCUMENTS 546856  6/1993  European Pat. Off. .

Primary Examiner—Hoa Van Le

[57] ABSTRACT

A photosensitive transfer sheet layered a releasable colored photosensitive layer comprising modified poly(vinyl alcohol) of either of following general formulae and adhesive and a heat-seal layer provided in turn on a supporter is disclosed,

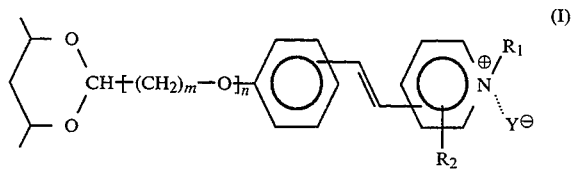

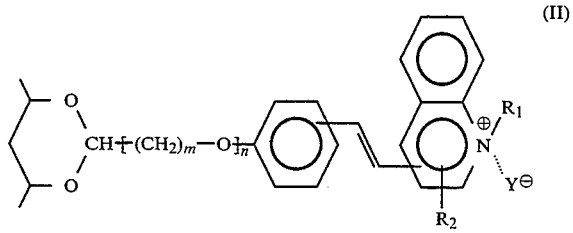

wherein $R_1$ and $R_2$ denote hydrogen atoms or alkyl groups independently one another, $Y^-$ denotes a conjugated chlorinic ion of acid, m denotes an integer of 1 to 6, and n denotes 0 or 1), thereby providing a multicolor image-forming material for obtaining high-precision prepress color proof being excellent in the preservability, possible to handle in a light room, water-developable and excellent in the registering accuracy as well.

5 Claims, No Drawings

PHOTOSENSITIVE TRANSFER SHEET

BACKGROUND OF THE INVENTION

The present invention relates to a multicolor image-forming material and, in more detail, it relates to a photosensitive transfer sheet to be used primarily for obtaining a prepress color proof usable for the proofreading operation indispensable in the photo-engraving process.

In the color printing, the prepress color proof is made for checking the finished color, tone, etc. of print mainly by overlay method or surprint method so far, depending on the shape thereof.

In the overlay method, each color-decomposed original plate is printed on a transparent supporter coated with colored sensitizer for every color and each color is superposed on a white sheet to perform the proofreading (U.S. Pat. No. 3136637, U.S. Pat. No. 3221553 and U.S. Pat. No. 3326682). This method allows rapid proof-making and can be utilized for preparing a color-separated proof by properly combining two or three colors. With this type, however, each transparent supporter is superposed, thus turbidity generates and remarkable difference occurs sensually compared with the print printed on a press or proofing machine.

As for the method to form a multicolor image by surprint system, various methods have been proposed. Thereamong, in a method of using pressure-sensitive adhesive, colored photosensitive layer and pressure-sensitive adhesive layer are layered in this order on a supporter and, after closely and sufficiently contacted the surface of adhesive layer with a white base paper mount to be transferred under pressure, the supporter is peeled off, thereby transferring the colored photosensitive layer onto the paper mount. Then, a color-decomposed manuscript corresponding to the color tone of said colored photosensitive layer is closely contacted and exposed to light, and the colored photosensitive layer is developed with exclusive developing solution and dried to make a decomposed image. Same procedure is repeated thereon further with remaining colors to form a multi-color image (Japanese Patent Publication No. Sho 47-27441).

Moreover, with respect to a method of transferring by heat without using pressure-sensitive adhesive, there are various proposals. These include, for example, a method wherein the manuscript is superposed and contacted closely with a material provided with colored photopolymerizable layer exhibiting adhesiveness at a temperature higher than certain temperature on a supporter and exposed to light, and only the nonexposed area is transferred onto a paper base because of the exposed area becoming to exhibit no adhesiveness (U.S. Pat. No. 3203805), a method wherein, after the colored polymerisable layer was exposed to light and developed, the colored image is transferred under heat onto a base having thermosensitive adhesive (U.S. Pat. No. 4304836), a method wherein, after a material consisting of supporter/release layer/colored photosensitive layer was exposed to light and developed to obtain a colored image, the thermosensitive adhesive is coated onto the surface receiving said adhesive or image to transfer under heat (U.S. Pat. No. 3721557, Japanese Patent Publication No. Sho 46-15326 and No. Sho 49-441), or the like.

So far, for the colored photosensitive layer (negative type) to be used for such purpose, various types have been proposed, but combinations of film-forming water-soluble high-molecular substance, photo-insolubilizing agent and coloring agent are used widely in general. As the film-forming water-soluble high-molecular substances, a lot of substances, e.g. poly(vinyl alcohol), gelatin, casein, glue, alginic acids, gums, cellulose derivatives such as carboxy-methylcellulose and hydroxymethylcellulose, polyacrylic acid and its salts, polymethacrylic acid and its salts, polyacrylamide, poly(ethylene oxide), poly(vinyl pyrrolidone), etc. can be mentioned. Also, the photo-insolubilizing agents include diazonium salts, their condensates, tetrazonium salts, bichromates, azide compounds, etc., thus many combinations are used.

With these combinations, however, under the influences that diazonium salts, their condensates, tetrazonium salts, etc. being the photo-insolubilizing agents are colored and, in addition, the photo-decomposed residues after exposure to light are colored, there have been drawbacks that the coloring agent used is contaminated making it difficult to obtain pure color tone of coloring agent and the feeling of transparency lacks. Further, it was needed to sufficiently take a care for the handling in all cases because of the fogging on preserving at high temperature and high humidity.

Moreover, previously, in Japanese Unexamined Patent Publication No. Sho 61-186955 and No. Sho 61-286858, a method of forming multicolor image and a material therefor applicable also to the color proof were found, which had a number of superiorities such that, since all the treatments could be carried out in a light room and the development treatment could also be performed only with water, they were advantageous in the aspects of environment and safety such as explosion and that they were excellent in the operativity and not only the material cost but also running cost could be saved drastically.

Namely, this is a method of forming a multicolor image characterized in that a heat-transferable photosensitive sheet provided with a colored photosensitive layer being water-soluble and insolubilized by light, of which photosensitive agent being represented by a general formula (I) or (II),

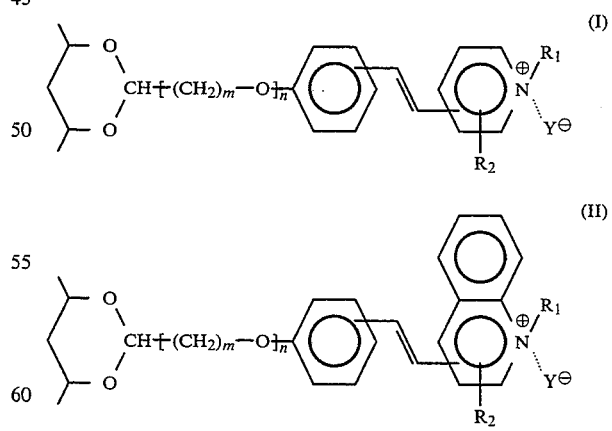

(wherein $R_1$ and $R_2$ denote hydrogen atoms or alkyl groups independently one another, $Y^-$ denotes a conjugated chlorinic ion of acid, m denotes an integer of 1 to 6, and n denotes 0 or 1), via a heat-fusible and-bondable intermediate layer on a transparent supporter is treated through the steps comprising:

(1) a step wherein said photosensitive material is contacted closely with a negative manuscript and exposed to actinic rays therethrough, and then the nonexposed area is dissolved out by washing with water to form an image, and (2) a step wherein the surface of said formed image is further contacted closely with the heat-fusible and -bondable surface of an image-receiving material having a heat-fusible and -bondable layer and pressurized under heat, and then the transparent supporter is peeled off from the intermediate layer having the heat-fusibility and -bondability to transfer the colored image onto the image-receiving material together with the intermediate layer, thus, first, photosensitive materials with colored photosensitive layer different in the color tones are prepared, negative manuscripts are selected corresponding to each color tone, they are contacted closely and exposed to light, and the colored photosensitive layers are washed with water to dissolve out nonexposed area to form images in the step (1), and, next, the colored image with a particular color tone thereamong is transferred onto the image-receiving material in the step (2), then (3) a step wherein the image surface of photosensitive material with a colored image different in the color tone from above is further contacted closely with the heat-fusible and -bondable surface of image-receiving material having finished the transfer obtained in the step (2) and pressurized under heat, and then the transparent supporter is peeled off from the intermediate layer to transfer the colored image onto the already transferred surface of image-receiving material together with the intermediate layer and, for the third and subsequent colors, the step (3) is repeated.

This method can give a prepress color proof being excellent in the preservability, allowable the development treatment only with water in addition to the handling in a light room, further, uncontaminative in the color tone of coloring agent used, and possible to finish very closely to the print or proof.

However, in this method, too, there was a problem in the registering accuracy for obtaining a prepress color proof with higher precision. That is, the problem lies in that, since the images with different color tones obtained previously by exposing the photosensitive materials to light and developing them are contacted one by one with the heat-fusible and -bondable surface of image-receiving material and they are transferred by the pressurizing treatment under heat, the registering is very difficult, leading to a poor accuracy of register.

The purpose of the invention is to provide a multicolor image-forming material usable for the high-precision prepress color proof with a finish very close to the print by surprint method, and, in more detail, to provide a multicolor image-forming material for obtaining the high-precision prepress color proof being excellent in the preservability, allowable the development treatment only with water in addition to the handing in a light room, further, uncontaminative in the color tone of coloring agent used, turbidity-free and excellent in the registering accuracy.

SUMMARY OF THE INVENTION

The inventors have found that, by preparing a photosensitive transfer sheet characterized by forming a water-soluble photo-insolubilizable colored photosensitive layer and a heat-seal layer on the surface of a release layer on a supporter having the release layer on one side, and by forming a multicolor image by method A or method B described below, the prepress color proof with high registering accuracy can be obtained.

( Method A )

A forming method of multicolor image by treating via:

(a) a step wherein the photosensitive transfer sheet is pressurized under heat with a first image-receiving sheet having a heat-fusible and -bondable layer, then the supporter is peeled off from the photosensitive layer to temporarily transfer the colored photosensitive layer onto the first image-receiving sheet together with the heat-seal layer, said photosensitive material is contacted closely with a negative manuscript and exposed to actinic rays therethrough, and the nonexposed area is dissolved out by washing with water to form an image, (b) a step wherein, further, the heat-adhesive surface of said photosensitive material having colored photosensitive layer with different color tone from above is contacted closely with the first color image surface on the first image-receiving sheet obtained in the step (a) and pressurized under heat, then the supporter is peeled off from the photosensitive layer to transfer the colored photosensitive layer onto the already transferred surface of the first image-receiving sheet together with the heat-seal layer, and a negative manuscript corresponding to the color tone is contacted closely and exposed to light, and the nonexposed area is dissolved out by washing with water to form a second color image, (c) a step wherein the operation of step (a) is repeated for said photosensitive materials with the third color and subsequent different color tones to form a multicolor image on said first image receiving sheet, (d) a step wherein the multicolor image on the first image-receiving sheet obtained in the step (c) is contacted closely with a second image-receiving sheet and pressurized under heat, and the first image-receiving sheet is peeled off from the interface between the heat-fusible and -bondable layer and the first color heat-seal layer on the first image-receiving sheet to temporarily transfer the multicolor image onto the second image-receiving sheet, and (e) a step wherein the multicolor image on the second image-receiving sheet obtained in the step (d) is contacted closely with a final transfer sheet and pressurized under heat, and the second image-receiving sheet is peeled off from the interface between the heat-fusible and -bondable layer and the last transferred image.

(Method B)

A forming method of multicolor image by treating via:

(a) a step wherein the photosensitive transfer sheet is pressurized under heat with a permanent image-receiving sheet having a heat-fusible and -bondable layer, then the supporter is peeled off from the photosensitive layer to transfer the colored photosensitive layer onto the permanent image-receiving sheet together with the heat-seal layer, said photosensitive material is contacted closely with a negative manuscript and exposed to actinic rays therethrough, and the nonexposed area is dissolved out by washing with water to form an image, (b) a step wherein, further, the heat-adhesive and -bondable surface of said photosensitive material having colored photosensitive layer with different color tone from above is contacted closely with the first color image surface on the permanent image-receiving sheet obtained in the step (a) and pressurized under heat, then the supporter is peeled off from the photosensitive layer to transfer the colored photosensitive layer onto the already transferred surface of permanent image-receiving sheet together with the heat-seal layer, and a negative manuscript corresponding to the color tone is contacted closely and exposed to light, and the nonexposed area is dissolved out by washing with water to form a second color image, and (c) a step wherein the operation of step (a) is repeated for said photosensitive materials with the third color and subsequent different color tones to form a multicolor image on said permanent image-receiving sheet.

The colored photosensitive layer of the inventive photosensitive transfer sheet has modified poly(vinyl alcohol), having at least one kind selected from stilbazolium group and stilquinolinium group represented by general formulae (I) and (II), respectively,

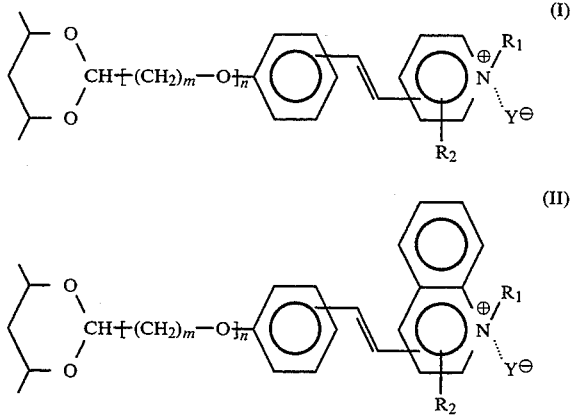

(wherein $R_1$ and $R_2$ denote hydrogen atoms or alkyl groups independently one another, $Y^-$ denotes a conjugated chlorinic ion of acid, m denotes an integer of 1 to 6, and n denotes 0 or 1) as a photosensitivity-adding group, and a coloring agent as major components, and the heat-seal layer comprises one or more of components selected from a group of polyester, acrylic resin, vinylidene chloride-vinyl chloride copolymer, vinyl chloride-vinyl acetate copolymer and ethylene-vinyl acetate.

DETAILED DESCRIPTION OF THE INVENTION

As the supporters to be used for the inventive photosensitive transfer sheet, paper, plastic film, paper/plastic composite material, glass plate, metal plate, etc. can be mentioned. In particular, plastic films of poly(ethylene terephthalate), polypropylene, polyethylene, poly(vinyl chloride), polystyrene, polycarbonate, triacetate, etc. are suitable and, thereamong, biaxially stretched poly(ethylene terephthalate) film is excellent in the strength, heat resistance, dimensional stability, etc., thus preferable. Though not restricted particularly, the thickness of supporter is suitable to be around 50 to 150 $\mu$m. Moreover, the supporter must have the release layer. That is, the colored photosensitive layer must be retained release-freely on the release surface.

The release layer to be used for the inventive photosensitive transfer sheet is preferable to consist of any of urethane resin, melamine resin, fluoro resin, silicone resin, polyester and polyolefin or a mixed system, and the coat weight is suitable to be 1 to 10 g/m$^2$, more preferably 2 to 5 g/m . Moreover, as for the peeling resistance between the release layer and the colored photosensitive layer provided thereon, if it is too low, then the colored photosensitive layer at sheet edges ends up to be peeled off during sheet cutting or operation, and, inversely, if it becomes higher, then the transferability onto image-receiving sheet decreases, hence the peeling resistance (measured according to ASTM D-903) is preferable to be within a range of 2.5 to 3.5 g/25 mm.

Moreover, by adding a matting agent to the release layer for matting, a matted pattern is formed also on the colored photosensitive layer and heat-seal layer provided thereon, allowing improved antiblocking performance, improved adhesion between the image-receiving sheet and the heat-seal layer due to easy escaping of air between both on transferring onto the image-receiving sheet under pressure and heat.

The matting agents used for such purpose include inorganic fine particles such as silicon dioxide, calcium carbonate and alumina, plastic powders such as polyethylene, polypropylene, poly(ethylene terephthalate), polystyrene, polycarbonate, acrylic ester resin, methacrylic resin, polyacrylonitrile and acrylonitrile copolymer, and further fine powders of starch, cellulose, etc., and the like. The size of matting agent is suitable to be 0.01 to 20 $\mu$m, more preferably 1 to 3 $\mu$m. By controlling the type of matting agent, particle size and addition level, the surface of release layer can be matted as desired.

As the water-soluble photo-insolubilizable colored photosensitive layers used for the inventive photosensitive transfer sheet, combinations comprising modified poly(vinyl alcohol) with photosensitive component as an adding group and coloring agent are used, on the assumption that the development only with water is possible in the steps (a), (b) and (c). Namely, such modified poly(vinyl alcohol) that has at least one kind selected from stilbazolium group and stilquinolinium group, which can exhibit pure color tone of coloring agent and is excellent in the preservability, as a photosensitive component-adding group is suitable in particular. The modified poly(vinyl alcohol) referred to so in the invention can be manufactured by the methods described in Japanese Patent Publication No. Sho 56-5761, No. Sho 56-5762 and No. Sho 56-11906.

As for the coloring agents, water-dispersible pigments, water- or alcohol-soluble dyes, etc. can be selected in a wide range, but they are required to be materials that have good compatibility with said water-soluble high-molecular substance, photo-insolubilizing agent and modified poly(vinyl alcohol)and do not adversely affect the photosensitivity, developability, etc. Moreover, the color tones thereof are basically four colors of cyan, magenta, yellow and black in the case of color proof in the photoengraving process, and, naturally, colors close to those of respective printing inks are desired.

The addition level of coloring agent is to be determined through the desired optical reflection density of said colored image after transferred-the formed image onto the image-receiving material, though it depends on the type and the coat weight of colored photosensitive layer.

To the colored photosensitive layer insolubilizable by light, stabilizing agent for preventing the dark reaction and leveling agent, defoamer, surfactant, etc. for improving the coatability upon providing said colored photosensitive layer on the surface of release layer can be added besides the materials above, if need be. Moreover, said components are mixed after dissolved or dispersed principally into water upon providing said colored photosensitive layer, but, for the purpose of defoaming or improved coatability, water-soluble organic solvents such as alcohols can be used partly as diluents, if need be.

The thickness of said colored photosensitive layer is preferable to be as thin as possible from the point of resolution such as half-tone reproduction, but, in view of the image density by coloring agent, it is suitable to be 0.5 to 5 g/m$^2$, more preferably 1 to 3 g/m$^2$.

Besides, upon providing said colored photosensitive layer on the release surface, any method publicly known hitherto can be used without particular restriction, provided that pinholes etc. do not generate and uniform coated film can be obtained.

The heat-seal layer used for the inventive photosensitive transfer sheet is selected from such materials that have sufficient adhesion to the colored photosensitive layer to be provided thereunder and insolubilized by light after insolubilization, that is coatable without infringing the colored photosensitive layer, that is water-insoluble and does not hinder the hue and transparency, that is nonadhesive at room temperature and becomes adhesive and fusible and bondable by heat, and that has sufficient adhesion also to the image-receiving sheet. For example, following film-forming high-molecular substances are mentioned; polyester resin, acrylic resin, vinylidene chloride-vinyl chloride copolymer, vinyl chloride-vinyl acetate copolymer and ethylene-vinyl acetate, in addition thereto, mutual mixtures of these high-molecular substances, mixtures with other high-molecular substances or mixed systems with other materials such as other high-molecular substances and plasticizers can also be used. For example, combinations of even those that exhibit the adhesiveness at room temperature with other materials that can prevent said adhesiveness, or combinations of even those that inversely do not exhibit the adhesiveness on heating with tackifiers, plasticizers, etc. are also conceivable. Hence, not only single material but also various combinations are conceivable depending on the type of supporter etc., if need be, and, for this reason, the heat-seal layer is not entirely restricted to said materials.

Moreover, by adding a matting agent to the heat-seal layer for matting, improved antiblocking performance, improved operativity on the image-receiving sheet and improved adhesion between the image-receiving sheet and the heat-seal layer due to easy escaping of air between both on transferring onto the image-receiving sheet under pressure and heat can be achieved. The matting agents used for such purpose include inorganic fine particles such as silicon dioxide, calcium carbonate and alumina, plastic powders such as polyethylene, polypropylene, poly(ethylene terephthalate), polystyrene, polycarbonate, acrylic ester resin, methacrylic resin, polyacrylonitrile and acrylonitrile copolymer, and further fine powders of starch, cellulose, etc., and the like.

The size of matting agent is suitable to be 0.01 to 10 μm, more preferably 1 to 3 μm. By controlling the type of matting agent, particle size and addition level, the surface of heat-seal layer can be matted as desired. For layering the heat-seal layer onto the colored photosensitive layer, the solution of high-molecular substance as described above is coated onto the colored photosensitive layer by a usual method and dried. The coat weight of heat-seal layer is suitable to be 0.5 to 5 g/m$^2$, more preferably 1 to 3 g/m$^2$.

For the supporter of the first image-receiving sheet used for the steps (a), (b) and (c) in the method A of the invention, a plastic film is suitable, since it is required to be water-resistant due to the use of water development and dimensionally stable under the conditions of high pressure and high temperature on layering. As the materials to be used for the heat-fusible and -bondable layer layering on the one side of said supporter, such materials that are non-adhesive at room temperature and exhibit adhesiveness and fusibility and bondability by heat, in more detail, such materials that can fuse and bond with the heat-seal layer of said photosensitive transfer sheet one another at the time of applying pressure and temperature and, when peeling off the supporter of photosensitive transfer sheet adhered under heat together with the release layer, the colored photosensitive layer can be transferred easily onto the image-receiving sheet together with the heat-seal layer are to be selected.

Moreover, for the supporter of the second image-receiving sheet used for the steps (d) and (e), a plastic film is suitable, since it is required to be dimensionally stable under high pressure and high temperature similarly to the first image-receiving sheet. The materials to be used for the heat fusible and -bondable layer layering on the one side of said supporter, such materials that are nonadhesive at room temperature and exhibit adhesiveness and fusibility and bondability by heat, in more detail, such materials that can fuse and bond with the colored image area (exposed area) of multicolor image layered on the first image-receiving sheet or the heat-seal layer (nonexposed area) at the time of applying pressure and temperature and, when peeling off the first image-receiving sheet addhered under heat from the interface between the heat-fusible and -bondable layer of the first image-receiving sheet and the heat-seal layer of the first color of multicolor image, the multicolor image can be transferred easily onto the second image-receiving sheet and when closely contacting the heat-seal layer of multicolor image having been transferred onto the second image-receiving sheet with a transfer paper, adhering them under pressure and heat and peeling off the second image-receiving sheet from the interface between the heat-fusible and -bondable surface of second image-receiving sheet and the last transferred image surface of multicolor image, the multicolor image can be transferred easily onto the transfer sheet are to be selected. Besides, upon layering the heat-fusible and -bondable materials of the first and second image-receiving sheet onto the supporter, they may be coated in the state of solution and dried similarly to the heat-seal layer or may be laminated in the state of film.

Furthermore, as the supporters of the permanent image-receiving sheet used for the method B, paper, plastic film, paper/plastic film composite material, glass plate, metal plate, etc. can be mentioned, and, when using a transparent supporter or the like, if need be, white pigment-coated layer can be provided on the surface to obtain the brightness like coated paper. Moreover, in the case of paper bases such as paperboard and coated paper, which have low water-resistance and tend to cause the dimensional change through humidity change, water-resistant layer and expansion/contraction-preventive layer can also be provided, if need be. As the materials to be used for the heat-fusible and -bondable layer layering onto said supporter, such materials that are nonadhesive at room temperature and exhibit adhesiveness and fusibility and bondability by heat, in more detail, such materials that can fuse and bond with the heat-seal layer of said photosensitive transfer sheet one another at the time of applying pressure and temperature and, when peeling off the transparent supporter of photosensitive transfer sheet adhered under heat, the colored photosensitive layer can be transferred easily onto the image-receiving sheet together with the heat-seal layer are to be selected. Upon layering this heat-fusible and -bondable material onto the supporter of permanent image-receiving sheet, it may be coated in the state of solution and dried similarly to the heat-seal layer or may be laminate in the state of film.

In order to further clarify the invention, the examples are shown below, but the invention is not confined thereto. Besides, "part" in the examples shows part by weight in all cases.

Example 1

| <Release layer-forming liquor> | |
|---|---|
| Tesfine 322 | 1.2 parts |
| (Acrylamide copolymer: Hitachi Chemical Polymer Co., Ltd.) | |
| Dryer 900 | 0.1 part |
| (p-Toluenesulfonic acid: Hitachi Chemical Polymer Co., Ltd.) | |
| Ryulon Qu-628 | 19.6 parts |
| (Vinyl chloride-vinyl propionate copolymer: Tosoh Corp.) | |
| Kurehalon SOA | 16.9 parts |
| (Vinylidene chloride-vinyl chloride copolymer: Kureha Chemical Industry Co., Ltd.) | |
| Epostar MS | 0.2 parts |
| (Benzoguanamine: Nippon Shokubai Kagaku Kogyo Co., Ltd.) | |
| Toluene | 25 parts |
| Methyl ethyl ketone | 25 parts |
| Cyclohexanone | 12 parts |
| <Colored photosensitive layer-forming liquor> | |
| Yellow liquor | |
| SBQ modified PVA 10% aqueous solution | 35.6 parts |
| (Introduced 1.22 mol % N-methylstilbazolium group, av. polymerization degree 1100, saponification degree 80%) | |
| SBQ modified PVA 14% aqueous solution | 8.5 parts |
| (Introduced 1.28 mol % N-methylstilbazolium group, av. polymerization degree 500, saponification degree 80%) | |
| Pigment dispersion | 1.5 parts |
| Methanol | 15 parts |
| Butanol | 4 parts |
| Water | 35.6 parts |
| Magenta liquor | |
| SBQ modified PVA 10% aqueous solution | 36.4 parts |
| (Introduced 1.22 mol % N-methylstilbazolium group, av. polymerization degree 1100, saponification degree 80%) | |
| SBQ modified PVA 11% aqueous solution | 8.3 parts |
| (Introduced 1.9 mol % N-methylstilbazolium group, av. polymerization degree 500, saponification degree 88%) | |
| Pigment dispersion | 2.3 parts |
| Methanol | 1.5 parts |
| Butanol | 4 parts |
| Water | 34 parts |
| Cyan liquor | |
| SBQ modified PVA 10% aqueous solution | 40 parts |
| (Introduced 1.22 mol % N-methylstilbazolium group, av. polymerization degree 1100, saponification degree 80%) | |
| SBQ modified PVA 11% aqueous solution | 6.4 parts |
| (Introduced 1.90 mol % N-methylstilbazolium group, av. polymerization degree 500, saponification degree 88%) | |

| -continued | |
|---|---|
| Pigment dispersion | 1.5 parts |
| Methanol | 1.5 parts |
| Butanol | 4 parts |
| Water | 33 parts |
| Black liquor | |
| SBQ modified PVA 10% aqueous solution | 34 parts |
| (Introduced 2.1 mol % N-methylstilbazolium group, av. polymerization degree 1100, saponification degree 80%) | |
| Pigment dispersion | 6 parts |
| Methanol | 38 parts |
| Butanol | 4 parts |
| Water | 18 parts |

Pigment dispersions of yellow, cyan, magenta and black for said colored photosensitive layer-forming liquors were obtained by using pigments of Permanent Yellow HR, Permanent Carmine FB, Phthalocyanine Blue and carbon black, respectively, and by dispersing for 3 hours on ink mixing mill with following formulation.

| Pigment | 20 parts |
|---|---|
| Nonionic surpactant | 1 part |
| (Mainly polyethyleneglycol alkylphenyl ether) | |
| Water | 80 parts |
| <Heat-seal layer-forming liquor> | |
| Elvalloy 741 | 4 parts |
| (Ethylene-vinyl acetate: DuPont Corp.) | |
| Vinylite VYHH | 4 parts |
| (Vinyl chloride-vinyl acetate copolymer: Union Carbide Corp.) | |
| Denkalac TL-03 | 2 parts |
| (Vinyl chloride-vinyl acetate copolymer: Denki Kagaku Kogyo K.K.) | |
| Toluene | 72 parts |
| Methyl ethyl ketone | 18 parts |

The release layer-forming liquor was coated onto one side of 100 μm thick biaxially stretched poly(ethylene terephthalate) film with Meyer bar and dried for 1 minute at 140° C. to form a release layer with about 3 g/m². Further, the yellow liquor of colored photosensitive layer-forming liquor was coated thereon with Meyer bar and dried to obtain a colored photosensitive layer with a coat weight of about 2 g/m². Also, with respect to other magenta, cyan and black, the colored photosensitive layers (coat weight, about 2 g/m²) were obtained similarly.

Following this, the heat-seal layer-forming liquor was coated onto each of said colored photosensitive layers with Meyer bar and dried for 1 minute at 110 ° C. to form a heat-seal layer with a thickness of about 1 g/m², thus obtaining the photosensitive transfer sheets. The peeling resistance between the release layer and the colored photosensitive layer of photosensitive transfer sheets obtained was 3.0 g/25 mm (measured according to ASTM D-903).

Moreover, apart from said Photosensitive transfer sheets, a solution of urethane resin (Adcoat AD557-1/Adcoat CAT-52: Toyo Morton Co., Ltd.) was coated onto one side of 100 μm thick biaxially stretched poly(ethylene terephthalate) film with Meyer bar and dried to form an anchor layer with about 3 g/m² and 80 μm thick sodium Ionomer Film HM-07 (Tamapoly K. K.) was laminated thereon to obtain a first image-receiving sheet. Similarly 80 μm thick sodium Ionomer Film HM-01 (Tamapoly K. K.) was laminated on the anchor layer to obtain a second image-receiving layer.

Using these materials, the multicolor image was formed as follows: Namely, when the heat-seal layer of said photosensitive transfer sheet for yellow was superposed with the heat-fusible and -bondable layer of the first image-receiving sheet and impressed through rollers heated to 110 ° C., and then the supporter of heat transfer sheet (100 μm thick poly(ethylene terephthalate) film) was peeled off together with the release layer, the yellow photosensitive layer was transferred onto the first image-receiving sheet together with the heat-seal layer. Therewith, the color-decomposed negative film for yellow plate was contacted closely and exposed to light for 30 seconds from a distance of 1 m with 2 kw high-pressure mercury arc lamp. Thereafter, the nonexposed area was washed with water of ambient temperature spouting from a nozzle pressurized to 1 kg/cm$^2$ to dissolve out and, after draining off, the first image-receiving sheet was dried with warm air of about 50° C. to obtain a negative-positive image colored in yellow.

Further, with the yellow image formed on said first image-receiving sheet, the heat-adhesive surface of heat transfer sheet for magenta was superposed and impressed through rollers heated to 110° C., and then the supporter of heat transfer sheet was peeled off together with the release layer, thereby the colored photosensitive layer for magenta was transferred onto the yellow image on the first image-receiving sheet together with the heat-seal layer. Therewith, the color-decomposed negative film for magenta plate was contacted closely and exposed to light. Then, the first image-receiving sheet was treated similarly to the case of yellow. After the magenta, treatment was made with cyan by the same method followed by the treatment with black to obtain a four-color multicolor image (black/cyan/magenta/ yellow/first image-receiving sheet) on the first image-receiving sheet.

Next, the black image surface of the first image-receiving sheet with four-color negative-positive image formed was superposed with the heat-fusible and -bondable layer of the second image-receiving sheet and impressed through rollers heated to 110° C., and then the first image-receiving sheet was peeled off from the interface between the heat-fusible and -bondable layer of the first image-receiving sheet and the heat-seal layer for yellow, thereby the four-color image was transferred onto the second image-receiving sheet (yellow/magenta/cyan/black/second image-receiving sheet).

Next, the heat-seal layer for yellow on said second image-receiving sheet was superposed with a coated paper and impressed through rollers heated to 110° C., and then the second image-receiving sheet was peeled off from the interface between the heat-fusible and -bondable surface of the second image-receiving sheet and the black image surface, thereby the four-color negative-positive image was transferred onto the coated paper (black/cyan/magenta/yellow/transfer paper).

A high-precision prepress color proof was obtained, in which the adhesion after transfer was good, the background contamination (contamination due to the nonexposed non-image area in photosensitive layer) was also hardly found and the registering accuracy was so excellent that the slipping out of image (out of register) on the proof of A2 size was 35 μm at maximum and which resembled closely to the final print.

Example 2

Except that the heat-seal layer-forming liquor of the photosensitive transfer sheet in Example 1 was altered as shown below, all were performed similarly to Example 1.

| <Heat-seal layer-forming liquor> | |
|---|---|
| Viron 20SS | 15 parts |
| (Polyester: Toyobo Co., Ltd.) | |
| Kurehalon SOA | 1.3 parts |
| (Vinylidene chloride-vinyl chloride copolymer: | |
| Kureha Chemical Industry Co., Ltd.) | |
| Toluene | 67 parts |
| MEK | 16.7 parts |

Similarly to Example 1, said heat-adhesive liquor was coated onto each of the colored photosensitive layers and dried for 1 minute at 100 ° C. to form a heat-seal layer with about 1 g/m$^2$, thus obtaining the photosensitive transfer sheets. Subsequent procedures were performed similarly to Example 1. In this case, too, a high-precision prepress color proof was obtained similarly to Example 1, in which the background contamination was hardly found and the registering accuracy was very excellent to be 45 μm at maximum and which resembled closely to the final print.

Example 3

Except that SBQ-PVA (modified poly(vinyl alcohol) having stilbazolium group as a photosensitivity-adding group) of the colored photosensitive liquor in Example 1 was altered to a modified poly(vinyl alcohol) having stilquinolinium as a photosensitivity-adding group, all were performed similarly to Example 1. In this case, too, a high-precision prepress color proof was obtained similarly to Example 1, in which the background contamination was hardly found and the registering accuracy was very excellent to be 40 μm at maximum and which resembled closely to the final print.

Comparative example

When making a prepress color proof of A2 size using the multicolor image-forming materials and the method described in previous Japanese Unexamined Patent Publication No. Sho 61-186955, the maximum slipping out of image (out of register) was 100 μm.

TABLE 1

| | Max. slipping out of image (A2 size) |
|---|---|
| Example 1 | 35 μm |
| Example 2 | 45 μm |
| Example 3 | 40 μm |
| Comparative example | 100 μm |

As described above, by using a modified poly(vinyl alcohol) having at least one kind selected from stilbazolium group and stilquinolinium group as a photosensitivity-adding group for the colored photosensitive layer and combining with an organic solvent-soluble type heat-seal agent, thus constituting a photosensitive transfer sheet of the invention, a high-precision prepress color proof being excellent in the preservability, allowable the development treatment only with water in addition to the handling in a light room, further, uncontaminative in the color tone of coloring agent used, turbidity-free and excellent in the registering accuracy as shown in Table 1 could be obtained.

What is claimed is:

1. A photosensitive transfer sheet to be used for the multicolor image-forming method comprising a release layer, a colored photosensitive layer being water-soluble and insolubilized by light and a heat-seal layer provided in turn on a supporter, the colored photosensitive layer containing modified poly(vinyl alcohol) having at least one kind selected from stilbazolium group and stilquinolinium group represented by general formulae (I) and (II), respectively.

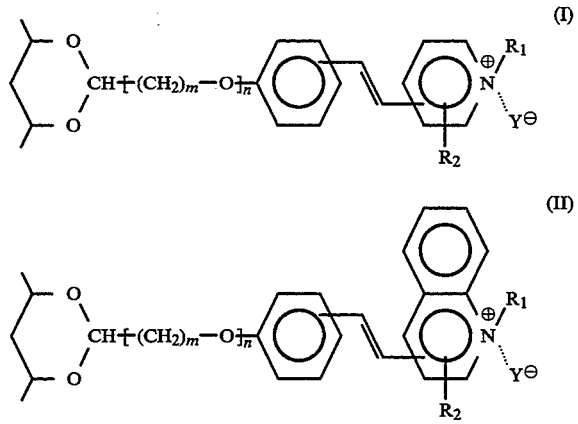

(wherein $R_1$ and $R_2$ denote hydrogen atoms or alkyl groups independently one another, $Y^-$ denotes a conjugated chlorinic ion of acid, m denotes an integer of 1 to 6, and n denotes 0 or 1), as a photosensitivity-adding group.

2. The photosensitive transfer sheet of claim 1, wherein said release layer is a coated release layer comprising any of urethane resin, melamine resin, fluoro resin, silicone resin, polyester and polyolefin or a fixed system, and has the peeling resistance (measured according to ASTM D-903) of 2.5 to 3.5 g/25 mm between it and the colored photosensitive layer provided thereon.

3. The photosensitive transfer sheet of claim 1 or 2, wherein the material of said heat-seal layer is an organic solvent-soluble type resin and a resin forming water-insoluble film.

4. The photosensitive transfer sheet of claim 3, wherein said organic solvent-soluble type resin forming the heat-seal layer is any of polyester, acrylic resin, vinylidene chloride-vinyl chloride copolymer, vinyl chloride-vinyl acetate copolymer and ethylene-vinyl acetate or a mixture.

5. The photosensitive transfer sheet of claim 1, wherein the surface of either or both of said heat-seal layer and release layer is a surface matted with matting agent.

* * * * *